(12) United States Patent
Kim

(10) Patent No.: US 6,693,474 B2
(45) Date of Patent: Feb. 17, 2004

(54) DELAY LOCKED LOOP DLL IN SEMICONDUCTOR DEVICE

(75) Inventor: Si-Hong Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/331,338

(22) Filed: Dec. 31, 2002

(65) Prior Publication Data

US 2004/0012427 A1 Jan. 22, 2004

(30) Foreign Application Priority Data

Jul. 19, 2002 (KR) ........................................ 2002-42259

(51) Int. Cl.[7] ................................................ H03L 7/06
(52) U.S. Cl. ........................................ 327/158; 327/161
(58) Field of Search .................................. 327/141, 143, 327/149, 150, 153, 158, 161; 375/376

(56) References Cited

U.S. PATENT DOCUMENTS

| | | | | |
|---|---|---|---|---|
| 5,771,264 A | * | 6/1998 | Lane | 375/376 |
| 6,314,052 B2 | * | 11/2001 | Foss et al. | 365/233 |
| 6,333,896 B1 | * | 12/2001 | Lee | 365/233 |
| 6,385,129 B1 | * | 5/2002 | Silvestri | 365/233 |
| 6,446,180 B2 | * | 9/2002 | Li et al. | 711/167 |
| 6,549,041 B2 | * | 4/2003 | Waldrop | 327/5 |
| 6,605,969 B2 | * | 8/2003 | Mikhalev et al. | 327/158 |

* cited by examiner

*Primary Examiner*—My-Trang Nu Ton
(74) *Attorney, Agent, or Firm*—Jacobson Holman PLLC

(57) ABSTRACT

A semiconductor device has a DLL circuit for generating an internal clock signal by receiving an external clock signal, wherein the DLL circuit includes a delay model for modeling delay time of an intern clock signal delayed from an external clock signal and a power supply for adjusting a core voltage by an input output voltage and supplying the adjusted voltage to the delay model.

4 Claims, 4 Drawing Sheets

DELAY LOCKED LOOP DLL IN SEMICONDUCTOR DEVICE

FIELD OF THE INVENTION

The present invention relates to a semiconductor device; and, more particularly, to a delay locked loop (DLL) in the semiconductor device.

DESCRIPTION OF RELATED ART

A delay locked loop (DLL) is a kind of a clock compensation circuit for accurately synchronizing a phase of an internal clock signal with that of an external clock signal and is universally applied to memories or ICs, such as SDRAM, DDR SDRAM and the like.

Generally, a chip for a synchronous semiconductor memory device employs a buffer for receiving an external clock signal supplied from an external circuit and generating an internal clock signal necessary to the chip in order to perform a high-speedy operation. A phase difference between the internal clock signal and the external clock signal is generated by passing through internal circuits in the chip. Therefore, operations of the internal circuits are delayed as much as the phase difference. The DLL generates the internal clock signal having the same phase with the external clock signal.

Hereinafter, a conventional DLL will be described according to accompanying drawings.

FIG. 1 is a block diagram illustrating the conventional DLL. The DLL includes a clock buffer 100, a variable delay line 102, a clock divider 104, a delay model 106, a delay control block 108, a clock driver 110 and an output terminal 112. The clock buffer 100 receives and buffers an external clock signal. An output signal from the clock buffer 100 is inputted to the variable delay line 102. An output signal from the variable delay line 102 is inputted to the clock driver 110 and the output terminal 112 outputs a data signal synchronized with an output signal from the clock driver 110. The delay model 106 monitors delay time for an output signal from the variable delay line 102. The clock divider 104 divides the output signal from the clock buffer 100 and the divide signal is inputted to the delay control block 108. The delay control block 108 compares the divided clock signal outputted from the clock divider 104 and the output signal of the delay model 106 and controls the variable delay line 102 according to a comparison result.

Generally, the delay model 106 is designed by modeling delay time of a delay path for the clock buffer 100, the clock driver 110 and the output terminal 112.

The output signal of the delay model 106 and the output signal of the clock divider 104 are inputted to the delay control block 108 for controlling to the variable delay line 102. The output signal of the variable delay line 102, which is controlled by the delay control block 108, is inputted to the clock driver 110. Finally, the data synchronized with the output signal of the clock driver 110 is outputted from the output terminal 112.

Since the delay model 106 is designed by modeling delay time for input/output drivers, an I/O voltage, which is used in the input/output drivers, should be used to the delay model 106 for an accurate modeling operation.

Since the I/O voltage has a characteristic that voltage level variation is severe, it is difficult to use the I/O power voltage as a power voltage for the delay model. Therefore, a core voltage Vcore, which is the same voltage level with the I/O voltage and has a stable voltage level, is employed.

If there is not the core voltage Vcore having the same voltage level with the I/O voltage, the I/O voltage has to be used. Recently, as the voltage level used in external semiconductor devices, such as a CPU and the like, interfacing with the memory device is decreased, the voltage level of the I/O voltage may be decreased lower than that of the core voltage Vcore.

Accordingly, if there is no the core voltage Vcore having the same voltage level with that of the I/O voltage, the I/O voltage has to be used, so that the I/O voltage applied to the delay model 14 becomes unstable due to a noise generated in an I/O driver operation. Therefore, there is a problem that a jitter of the DLL is generated.

SUMMARY OF THE INVENTION

It is, therefore, an object of the present invention to provide a delay locked loop (DLL) improving a noise characteristic of a delay model in a semiconductor device.

In accordance with an aspect of the present invention, there is provided a semiconductor device, having a DLL circuit for generating an internal clock signal by receiving an external clock signal, wherein the DLL circuit includes: a delay model for modeling delay time of an intern clock signal delayed from an external clock signal; and a power supply for adjusting a core voltage by an input output voltage and supplying the adjusted voltage to the delay model

BRIEF DESCRIPTION OF THE INVENTION

The above and other objects and features of the instant invention will become apparent from the following description of preferred embodiments taken in conjunction with the accompanying drawings, in which.

DETAILED DESCRIPTION OF THE INVENTION

Hereinafter, a delay locked loop (DLL) capable of reducing a jitter for an output signal of a delay mode by supplying a stable voltage according to the present invention will be described in detail referring to the accompanying drawings.

Figure 1:
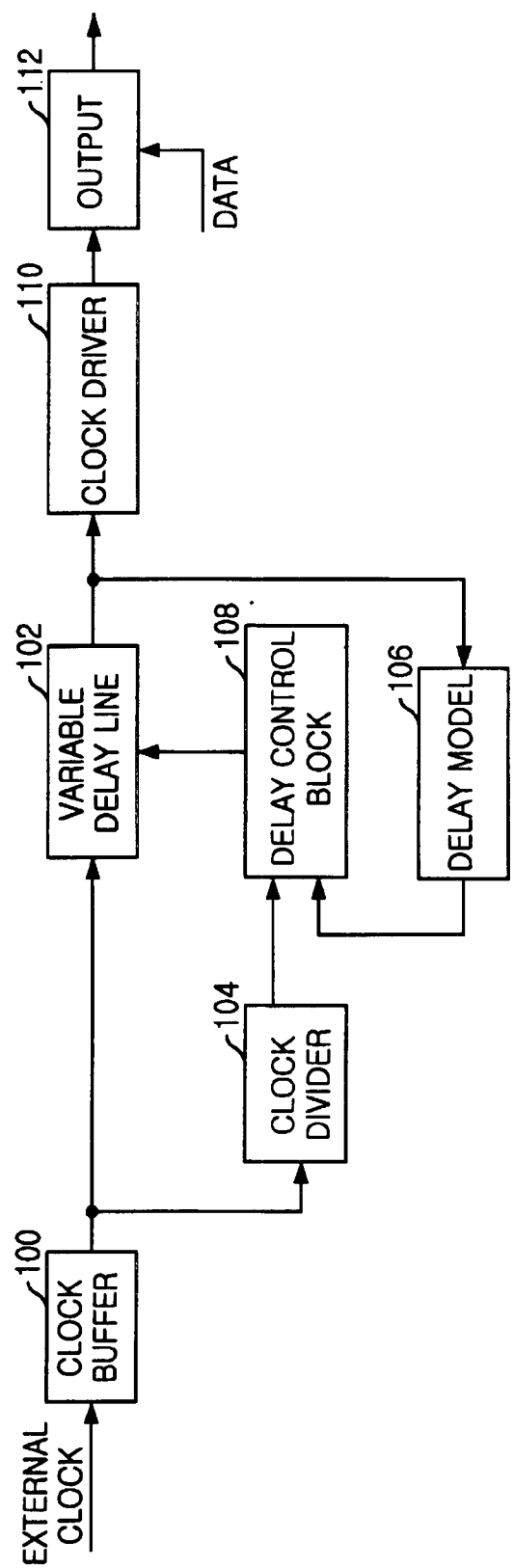
FIG. 1 is a block diagram illustrating the conventional DLL.
Figure 2:
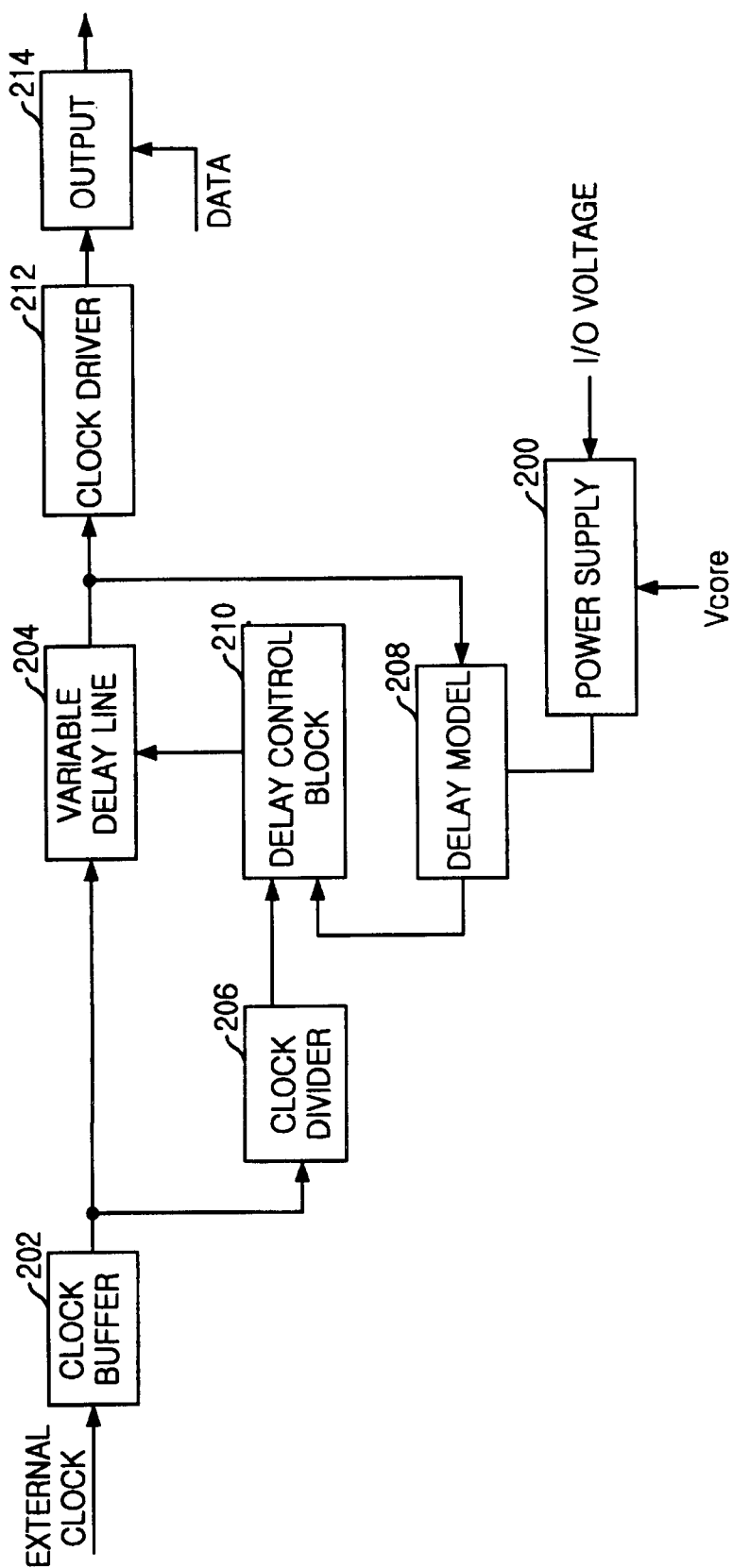
FIG. 2 is a block diagram illustrating the DLL in accordance with the preferred embodiment of the present invention.

FIG. 2 is a block diagram illustrating the DLL in accordance with the preferred embodiment of the present invention.

As shown, the DLL includes a delay model 208 for modeling delay time of an internal clock signal, a delay control block 210 for controlling delay time according to the comparison result of output signals of a clock divider 206 and the delay model 208, a variable delay line 204 for outputting the internal clock signal synchronized with the external clock signal under control of the delay control block and a voltage supply 200 for supplying a voltage to the delay model 140 by adjusting a core voltage Vcore to an I/O voltage $V_{I/O}$.

The DLL further includes a clock divider 206 for conversing the internal clock signal of a high frequency to a clock signal of a low frequency, a clock driver receiving the internal clock signal synchronized with the external signal and an output terminal for outputting data synchronized with the internal clock signal.

Figure 3:
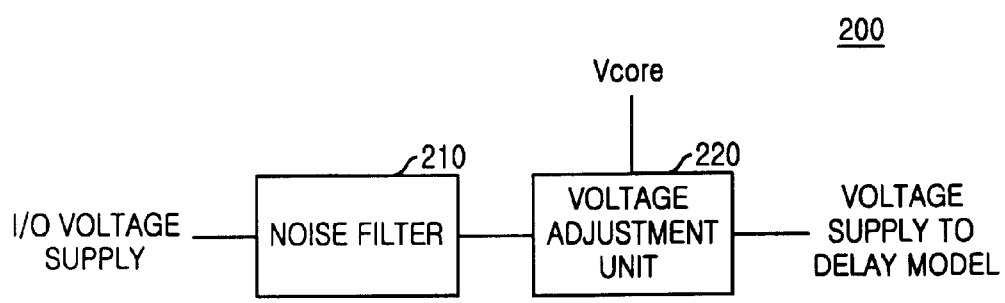
FIG. 3 is a block diagram illustrating the voltage supply in FIG. 2.

FIG. 3 is a block diagram illustrating the voltage supply 200 in FIG. 2.

As shown, the voltage supply 140 includes a noise filter 210 for removing a noise from the I/O voltage and a voltage adjustment unit 220 for adjusting the core voltage Vcore to a noise-removed I/O voltage $V_{I/O}$ by using the noise-removed I/O voltage $V_{I/O}$ as a reference voltage.

Figure 4:
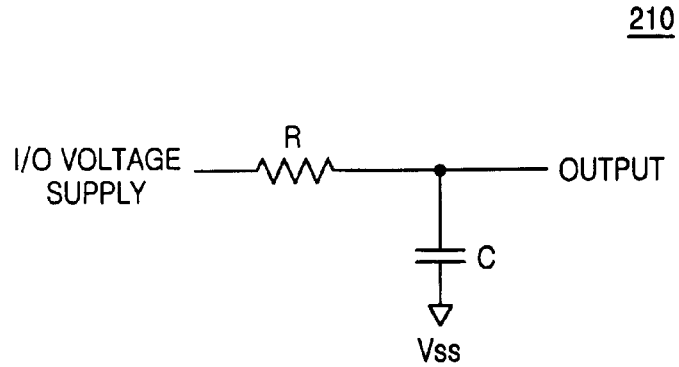
FIG. 4 is a detailed circuit diagram illustrating the noise filter in FIG. 3.

FIG. 4 is a detailed circuit diagram illustrating the noise filter 210 in FIG. 3.

As shown, the noise filter 210 is a low path filter including a resistance R and a capacitor C.

Figure 5:
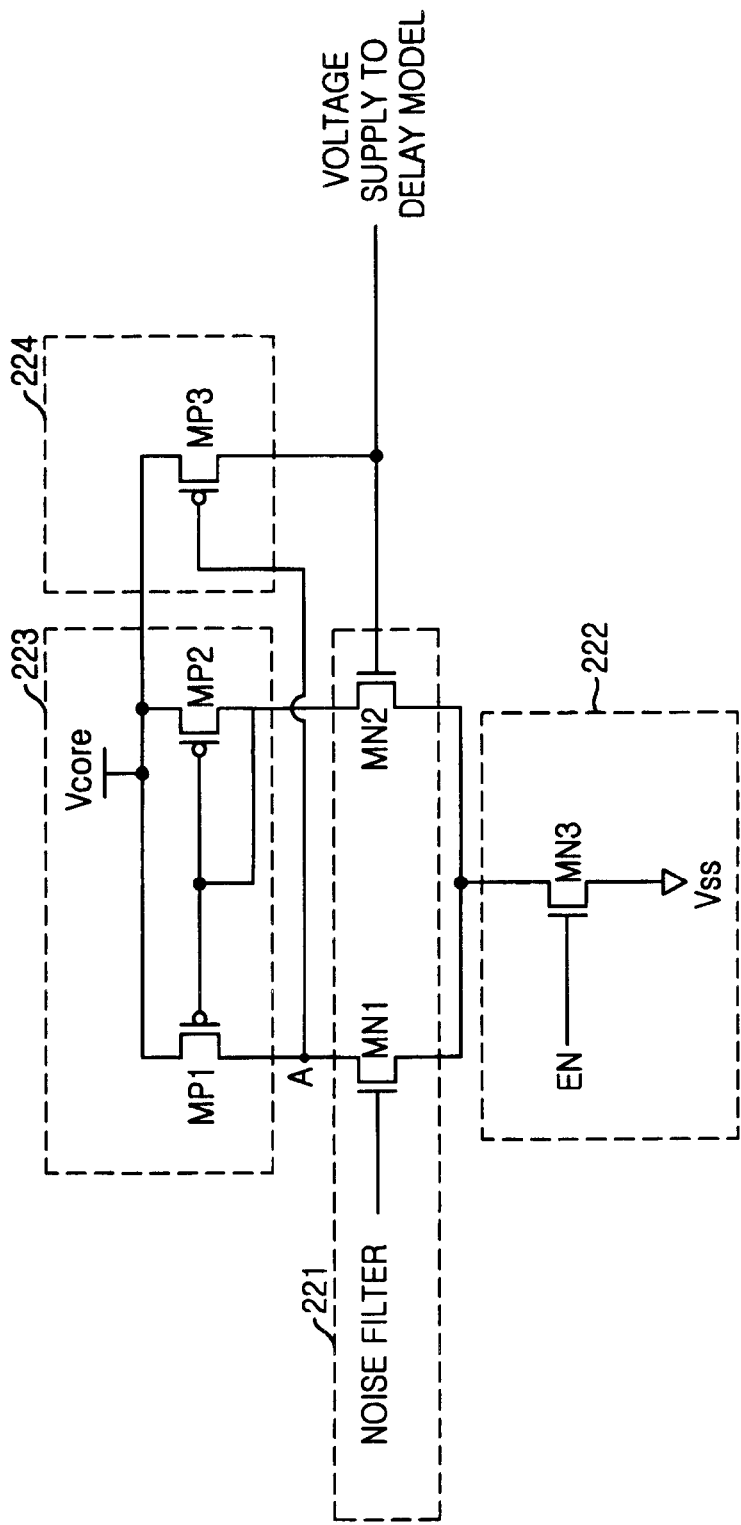
FIG. 5 is a detailed circuit diagram illustrating the voltage adjustment unit in FIG. 3.

FIG. 5 is a detailed circuit diagram illustrating the voltage adjustment unit 220 in FIG. 3.

As shown, the voltage adjustment unit 220 includes a first NMOS transistor MN1 whose gate is coupled to an output of the noise filter 210, a second NMOS transistor MN2 whose gate is coupled to an input of the delay model 140, a third NMOS transistor MN3, which an enable signal EN is applied to a gate thereof, coupled between a common node of the first and second NMOS transistor MN1 and MN2 and ground $V_{ss}$.

The voltage adjustment unit 220 further includes first and second PMOS transistors MP1 and MP2 forming current mirror and supplying the core voltage Vcore to the first and second NMOS transistors MN1 and MN2, respectively, and a third PMOS transistor MP3 whose gate is coupled to a common node A of the first NMOS transistor MN1 and the first PMOS transistor MP1 and drain/source are coupled between the core voltage Vcore and the input of the delay model 140. The second PMOS transistor MP2 is diode-coupled and the third PMOS transistor MP3 is, also, coupled to the gate of the NMOS transistor MN2.

Referring to FIGS. 2 to 5, an operation of the DLL will be described in accordance with the present invention.

An operation of DLL in accordance with the present invention is identical to that of typical DLL for outputting an internal clock signal synchronized with an external clock signal.

The delay model 140 is designed for modeling the delay time of phase between the external clock signal and the internal clock signal. An operation characteristic of DLL is determined according to how accurate modeling for the delay time is implemented. Therefore, a voltage for the delay model 204 should be used with a voltage used in internal circuits to be modeled. However, since the I/O voltage $V_{I/O}$ has a characteristic that the voltage variation is high, the core voltage Vcore is employed as a power voltage for the delay model.

As a voltage level used in the external circuit interfacing with the memory device is decreased, the core voltage having the same voltage level with that of the I/O voltage may not exist. At this time, the voltage supplying unit 200 supplies the I/O voltage adjusted by the core voltage Vcore as a reference voltage to the delay model in accordance with the present invention.

Even if the core voltage is used as the reference voltage, since the I/O voltage has a high voltage level variation, the I/O voltage is applied to the voltage adjustment unit 200 via the noise filter 210. The noise filter 210 is embodied by a low pass filter consisting of one resistance and one capacitor in accordance with the preferred embodiment of the present invention. However, another low pass filter can be applied to the present invention.

Subsequently, an operation of the voltage adjustment unit 220 will be described.

When the enable signal EN is applied with a logic high level and the output signal of the noise filter 210, which is the noise-removed voltage, is applied to the first NMOS transistor MN1, the first NMOS transistor MN1 is turned on, so that a voltage level of the node A goes to a logic low level. Therefore, the third PMOS transistor MP3 is turned on and the core voltage Vcore is supplied to the power voltage input of the delay model 208.

As the voltage level of the power voltage input of the delay model 140 is increased over a threshold voltage of the second NMOS transistor MN2, the second NMOS transistor MN2 is turned on. Thereafter, a voltage level of a common node for the second NMOS transistor MN2 and the second PMOS transistor MP2 becomes a logic low level, so that the first and second PMOS transistors MP1 and MP2 are turned on. Since the first PMOS transistor MP1 is turned on, a voltage level of the node A is increased, so that the third PMOS transistor MP3 is turned off. Accordingly, the voltage level of the output of the noise filter 210 is maintained in the same voltage level of the voltage supply of the delay model 208.

When the core voltage Vcore is different from the I/O voltage, reliability of the DLL is improved by using the voltage supplied from the voltage supply 200 in accordance with the present invention. The voltage form the voltage supply 200 in accordance with the present invention is just applied to modeling circuits using the I/O voltage and different voltage are used in modeling circuits not using the I/O voltage. Also, the present invention can be applied when the core voltage Vcore is lower than the I/O voltage.

Accordingly, the jitter of the delay model can be reduced by supplying the stable power voltage to the delay model in accordance with the present invention.

While the present invention has been described with respect to the particular embodiments, it will be apparent to those skilled in the art that various changes and modifications may be made without departing from the spirit and scope of the invention as defined in the following claims.

What is claimed is:

1. A semiconductor device comprising a DLL circuit for generating an internal clock signal by receiving an external clock signal, wherein the DLL circuit includes:

a delay model for modeling delay time of the internal clock signal delayed from the external clock signal; and a power supply for adjusting a core voltage by an input output voltage and supplying the adjusted voltage to the delay model.

2. The semiconductor device as recited in claim 1, wherein the power supply includes:

a noise filter for filtering a noise of the I/O voltage; and a voltage adjusting unit for adjusting the core voltage by the noise-filtered I/O voltage as a reference voltage.

3. The semiconductor device as recited in claim 2, wherein the noise filter is a low pass filter consisting of a resistance and a capacitor.

4. The semiconductor device as recited in claim 2, wherein the voltage adjusting unit includes:

first and second NMOS transistors whose gates are coupled to the noise filter and the delay model, respectively;

a third NOS transistor coupled between a common node of the first and second NMOS transistors and a ground voltage and an enable signal is applied to a gate thereof;

a first PMOS transistor, which is diode-coupled, for supplying the core voltage to the second NMOS transistor;

a second PMOS transistor for supplying the core voltage to the first NMOS transistor, wherein the second PMOS transistor forms a current mirror with the first PMOS transistor; and a third PMOS transistor PMOS transistor for supplying the core voltage to the delay model and a gate thereof is coupled to the first NMOS transistor.

* * * * *